United States Patent
Chen

(10) Patent No.: US 7,138,932 B1
(45) Date of Patent: Nov. 21, 2006

(54) SIGNAL CONVERTING APPARATUS FOR INTEGRATING ANALOG-TO-DIGITAL CONVERTER AND DIGITAL-TO-ANALOG CONVERTER AND INTEGRATION UNIT

(75) Inventor: Hsu-Min Chen, Hsinchu (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 11/216,402

(22) Filed: Aug. 30, 2005

(30) Foreign Application Priority Data

May 18, 2005 (TW) ................................. 94116050 A

(51) Int. Cl.
*H03M 1/02* (2006.01)
(52) U.S. Cl. ...................... 341/108; 341/110; 341/126; 341/143; 341/144; 341/155
(58) Field of Classification Search ................ 341/108, 341/110, 126
See application file for complete search history.

(56) References Cited

U.S. PATENT DOCUMENTS

| | | | | |
|---|---|---|---|---|
| 4,609,906 A | * | 9/1986 | Wiegel | 341/108 |
| 5,003,309 A | * | 3/1991 | Asghar et al. | 341/108 |
| 5,331,321 A | * | 7/1994 | Mannonen | 341/110 |
| 5,432,513 A | * | 7/1995 | Okamoto | 341/108 |
| 5,818,370 A | * | 10/1998 | Sooch et al. | 341/120 |
| 6,255,972 B1 | * | 7/2001 | Gross et al. | 341/126 |

* cited by examiner

*Primary Examiner*—Rexford Barnie
*Assistant Examiner*—Khai Nguyen
(74) *Attorney, Agent, or Firm*—J.C. Patents

(57) ABSTRACT

A signal converting apparatus for integrating an analog-to-digital converter (ADC) and a digital-to-analog converter (DAC) and an integration unit thereof are provided. The present invention integrates ADC and DAC, that do not operate simultaneously, into a signal converting apparatus (SCA), wherein a control signal decides whether an analog-to-digital mode or a digital-to-analog mode is selected. By sharing the operational amplifiers and other components in the SCA, the chip area and the cost are significantly reduced. In addition, in the integration unit, by switching a plurality of capacitor sets with various capacitances, the capacitance coefficients required for switching ADC and DAC are obtained.

10 Claims, 9 Drawing Sheets

US 7,138,932 B1

SIGNAL CONVERTING APPARATUS FOR INTEGRATING ANALOG-TO-DIGITAL CONVERTER AND DIGITAL-TO-ANALOG CONVERTER AND INTEGRATION UNIT

CROSS-REFERENCE TO RELATED APPLICATION

This application claims the priority benefit of Taiwan application serial no. 94116050, filed on May 18, 2005. All disclosure of the Taiwan application is incorporated herein by reference.

BACKGROUND OF THE INVENTION

1. Field of Invention

The present invention relates to a signal converting apparatus (SCA) between an analog signal and a digital signal, and particularly to a signal converting apparatus (SCA) for integrating an analog-to-digital converter (ADC) and a digital-to analog converter (DAC) and an integration unit thereof.

2. Description of the Related Art

FIG. 1 is a block diagram showing a conventional processing structure of analog and digital signals. In general, an ADC 110 and a DAC 130 are two independent analog circuits designed separately. For converting an analog signal A1 into a digital signal D1, the analog signal A1 should be converted into a digital signal D1 by the ADC 110 first, then sent to a processor 120 (for example, a digital signal processor DSP) to process the digital signal. If the digital signal D2 output from the processor 120 is to be converted into an analog signal A2, the DAC 130 converts the digital signal D2 from the processor 120 into an analog signal A2 for output.

In real practice, however, there is little chance to conduct signal converting of both ADC and DAC simultaneously. In other words, only one converter, either the ADC 110 or the DAC 130, converts signals, while the other converter is idle. Thus, the circuit utility rate is low.

SUMMARY OF THE INVENTION

An object of the present invention is to provide a signal converting apparatus (SCA) for integrating ADC and DAC, which do not operate simultaneously, into a common circuit, wherein a control signal decides whether an analog-to-digital mode or a digital-to-analog mode is selected. By sharing the operational amplifiers and other components in the SCA, the chip area and the cost are significantly reduced.

Another object of the present invention is to provide an integration unit, wherein a capacitance coefficient required for switching ADC and DAC is obtained by switching a plurality of capacitor sets with various capacitance ratios.

Based on the above objects and others, the present invention provides a signal converting apparatus (SCA), which is operated in an analog-to-digital mode or a digital-to-analog mode according to the control signal. In the analog-to-digital mode, an analog signal from an analog input end is converted and a converted digital signal is output at a digital output end; while in digital-to-analog mode, a digital signal from a digital input end is converted and a converted analog signal is output at an analog output end. The SCA includes a feedback unit, a first sampling unit, a first integrator and a quantizer. The feedback unit outputs at least one feedback signal according to the digital signal output from the digital output end. The first sampling unit is coupled to the analog input end, the digital input end and the feedback unit. In the analog-to-digital mode, the first sampling unit is used for sampling the analog signal from the analog input end as a sampling signal during a first period, and outputting a differential signal according to the sampling signal and the corresponding feedback signal output from the feedback unit during a second period. In the digital-to-analog mode, the first sampling unit is used for sampling the digital signal from the digital input end as a sampling signal during the first period and outputting a differential signal according to the sampling signal and an integration result from one of the integrators disposed between the first sampling unit and the analog output end during the second period. The first integrator is electrically coupled to the first sampling unit and the analog output end for integrating the differential signal. The quantizer is electrically coupled to the first integrator and the digital output end for quantizing the input of the quantizer and providing a digital signal output from the digital output end.

According to the embodiment of the present invention, the above-mentioned first sampling unit of the SCA includes a first capacitor, a first switch set, a second switch set, a first switch and a second switch. The first switch set is coupled to the analog input end and the first capacitor. In the analog-to-digital mode, the first switch set connects the analog signal of the analog input end to the first end of the first capacitor during the first period and disconnects it during the second period. In the digital-to-analog mode, the first switch set connects the integration result from one of the integrators disposed between the first sampling unit and the analog output end to the first end of the first capacitor during the second period and disconnects it during the first period. The second switch set is coupled to the digital input end and the first capacitor. In the analog-to-digital mode, the second switch set charges the first capacitor according to the corresponding feedback signal output from the feedback unit during the second period and disconnects it during the first period. In the digital-to-analog mode, the second switch set charges the first capacitor according to the digital signal at the digital input end during the first period and disconnects it during the second period. The first switch is coupled between the second end of the first capacitor and the first reference voltage, for connecting the first reference voltage to the second end of the first capacitor during the first period and disconnecting it during the second period. The second switch is coupled between the second end of the first capacitor and the first integrator, for electrically connecting the second end of the first capacitor to the first integrator during the second period and disconnecting it during the first period.

According to the embodiment of the present invention, the above-mentioned SCA further includes at least an integration unit, which is electrically connected in series between the first integrator and the quantizer and further electrically connected in series between the first integrator and the analog output end. The integration unit includes a second sampling unit and a second integrator. In the analog-to-digital mode, the second sampling unit samples the input signal of the integrator unit and outputs a second differential signal according to the sampling result and the corresponding feedback signal output from the feedback unit. In the digital-to-analog mode, the second sampling unit samples the input signal of the integrator unit and outputs the differential signal according to the sampling result and the integration result from one of the integrators disposed between the integration unit and the analog output end. The second integrator is electrically coupled to the second sampling unit and the analog output end for integrating the differential signal.

On the other hand, the present invention provides an integration unit, having an input end and an output end. The integration unit includes a first capacitor device, a second capacitor device, a first switch, a second switch, a third switch, a fourth switch and an operational amplifier. The capacitance of the first capacitor device is determined by a control signal. The capacitance of the second capacitor device is determined by the control signal. The first end of the first switch is the input end of the integration unit, and the second end of the first switch is coupled to the first end of the first capacitor device. The first switch is on during the first period, connecting the first end and second end of the first switch, and is off during the second period. The first end of the second switch is coupled to the first end of the first capacitor device, and the second end of the second switch is coupled to a first voltage. The second switch is on during the second period, connecting the first end and second end of the second switch, and is off during the first period. The first end of the third switch is coupled to the second end of the first capacitor device, and the second end of the third switch is coupled to a second voltage. The third switch is on during the first period, connecting the first end and second end of the third switch, and is off during the second period. The first end of the fourth switch is coupled to the second end of the first capacitor device, and the second end of the fourth switch is coupled to the first end of the second capacitor device. The fourth switch is on during the second period, connecting the first end and second end of the fourth switch, and is off during the first period. The first input end of the operational amplifier is coupled to the first end of the second capacitor device, and the output end of the operational amplifier is coupled to the second end of the second capacitor device.

Since ADC and DAC, which do not operate simultaneously, are integrated into a common circuit and a control signal decides whether an analog-to-digital mode or a digital-to-analog mode is selected in the present invention, the operational amplifiers and other components can be shared and the chip area and the production cost is significantly reduced. In addition, the present invention provides an integration unit, by which capacitance coefficient required for the analog-to-digital mode or the digital-to-analog mode are obtained by switching a plurality of capacitor sets with various capacitance ratios.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Since both a $\Sigma/\Delta$ (integration/difference) ADC and a switching-capacitor DAC are analog circuits and can be implemented by a switching-capacitor circuit, the purpose of integrating a ADC and DAC into a single signal converting apparatus (SCA) can be achieved by sharing some analog components, for example, operational amplifiers and capacitor devices whose capacitance ratio is adjustable, and switching capacitance coefficient required for the analog-to-digital mode or the digital-to-analog mode.

Figure 1:
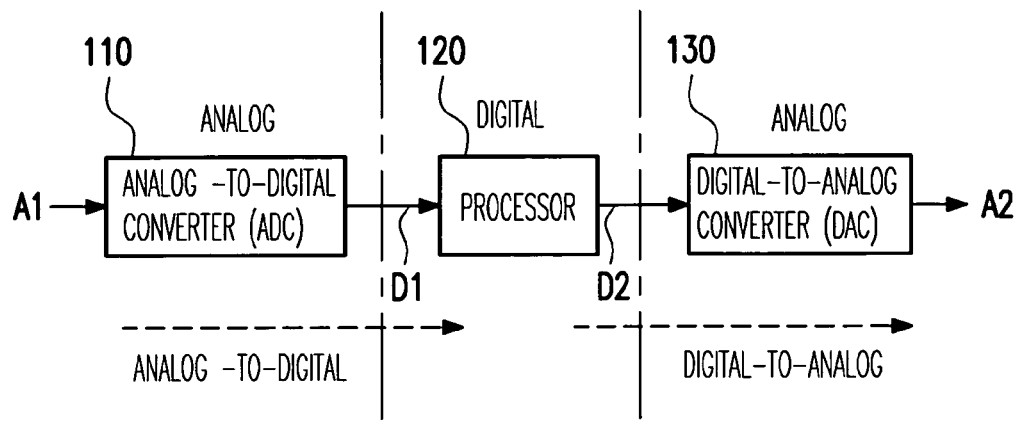
FIG. 1 is a block diagram showing a conventional processing structure of analog-digital signals.
Figure 2:
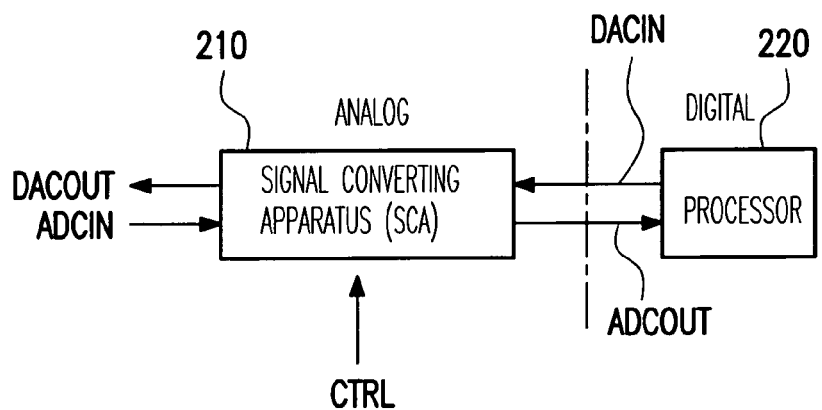
FIG. 2 is a block diagram showing a processing structure of analog-digital signals according to an embodiment of the present invention.

FIG. 2 is a block diagram showing a processing structure of analog-digital signals according to an embodiment of the present invention. Referring to FIG. 2, an ADC and a DAC are integrated into a signal converting apparatus (SCA) 210. To convert an analog signal ADCIN into a digital signal ADCOUT, a control signal CTRL is used for setting the SCA 210 as the analog-to-digital mode. Accordingly, the SCA 210 converts the analog signal ADCIN at the analog input end thereof into a digital signal ADCOUT, which is output to a processor 220 (for example, a digital signal processor DSP) via the digital output end of the SCA for digital signal processing. When converting a digital signal DACIN output from the processor 220 into an analog signal DACOUT, the control signal CTRL is used for setting the SCA 210 as the digital-to-analog mode. Accordingly, the SCA 210 receives the digital signal SACIN processed by the processor 220 at the digital input end thereof and then converts the received signal into an analog signal DACOUT for output at the analog output end of the SCA. The signal converting apparatus (SCA) 210 can be implemented according to the block diagram 300 in FIG. 3.

Figure 3:
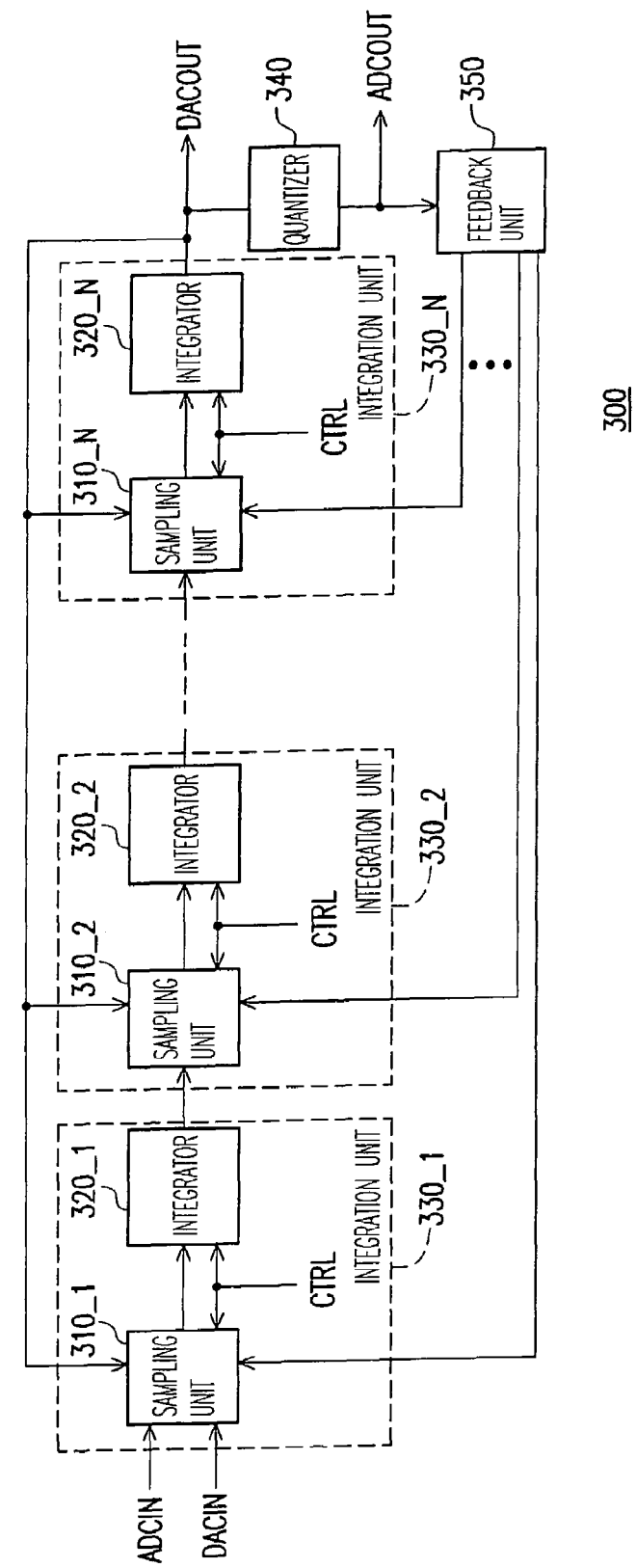
FIG. 3 is a block diagram showing a signal converting apparatus (SCA) for integrating an N-order $\Sigma/\Delta$ ADC and an N-order switching-capacitor DAC according to an embodiment of the present invention.

FIG. 3 is a block diagram showing a signal converting apparatus (SCA) for integrating an ADC and a DAC according to an embodiment of the present invention. Referring to FIG. 3, the SCA 300 is formed by N pieces of integration units 330_1~330_N connected in series. Wherein, N is an integer larger than zero and the last stage of the integration unit 330_N outputs the analog signal DACOUT. The quantizer 340 is used for quantizing the input signal thereof and providing the digital signal ADCOUT output at the digital output end. The SCA 300 is an embodiment of integrating an N-order $\Sigma/\Delta$ ADC and an N-order switching-capacitor DAC.

The SCA 300 is set as an analog-to-digital mode or a digital-to-analog mode by the control signal CRTL. In the analog-to-digital mode, the SCA 300 converts the analog signal ADCIN at the analog input end thereof into a digital signal ADCOUT for output at the digital output end of the SCA. While in the digital-to-analog mode, the SCA 300 converts the digital signal DACIN at the digital input end thereof into an analog signal DACOUT for output at the analog output end of the SCA.

A feedback unit 350 outputs N pieces of feedback signals in response to the digital signal ADCOUT output from the digital output end. When the SCA 300 works in an analog-to-digital mode, during the first period, the sampling unit of each odd-stage integration unit samples an analog signal output from a last-stage integration unit. For example, a first sampling unit 310_1 samples an analog signal ADCIN at the analog input end. Meanwhile, the sampling unit of each even-stage integration unit outputs a differential signal to a corresponding integrator according to a previously sampled signal and a corresponding feedback signal output from the feedback unit 350. When the SCA 300 works in analog-to-digital mode, during the second period, the sampling unit of each odd-stage integration unit outputs a differential signal to a corresponding integrator according to a last sampled signal and a corresponding feedback signal output from the feedback unit 350. For example, the first sampling unit 310_1 outputs a differential signal to the corresponding first integrator 320_1. Meanwhile, the sampling unit of each even-stage integration unit samples an analog signal output from a last-stage integration unit. For example, a second sampling unit 310_2 samples an analog signal output from the first integrator 320_1. Every integrator 320_1~320_N of all integration units integrates the differential signal output from the corresponding sampling unit. For example, the second integrator 320_2 integrates the differential signal output from the second sampling unit 310_2.

When the SCA 300 works in the digital-to-analog mode, during the first period, the sampling unit of each odd-stage integration unit samples a signal output from a last-stage integration unit. For example, the first sampling unit 310_1 samples a digital signal DACIN at the digital input end. Meanwhile, the sampling unit of each even-stage integration unit outputs a differential signal to a corresponding integrator according to the sampling signal and the integration result from one of the integrators disposed between the sampling unit and the analog output end of the SCA 300. In the embodiment, the SCA 300 in digital-to-analog mode is designed as an N-order switching-capacitor DAC, every sampling unit 310_1~310_N is accordingly allowed to receive the integration result from the last-stage integrator 320_N. Thus, at this time, the sampling unit of each even-stage integration unit outputs a differential signal to a corresponding integrator according to the sampling signal and the integration result from the last-stage integrator 320_N. During the second period, the sampling unit of each odd-stage integration unit outputs a differential signal according to the previously sampled signal and the integration result from the last-stage integrator 320_N. For example, the first sampling unit 310_1 outputs a differential signal to the first integrator 320_1 according to the last sampled signal and the integration result from the last-stage integrator 320_N.

Figure 4:
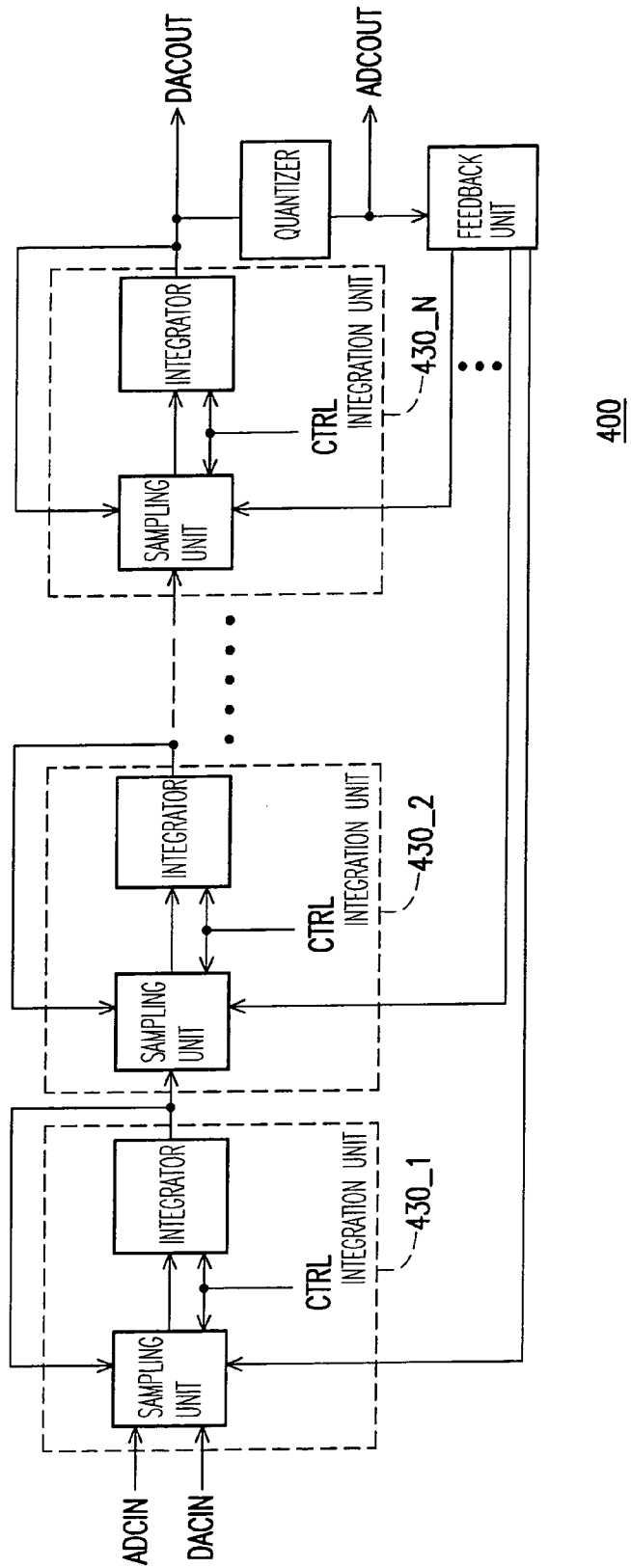
FIG. 4 is a block diagram showing a signal converting apparatus (SCA) for integrating an N-order $\Sigma/\Delta$ ADC and N pieces of 1-order switching-capacitor DAC according to an embodiment of the present invention.

Nevertheless, the SCA in the digital-to-analog mode can be designed with other structure of switching-capacitor DACs. For example, anyone skilled in the art is able to form the SCA in the digital-to-analog mode with a plurality of 2-order switching-capacitor DACs connected in series. FIG. 4 is a block diagram showing a signal converting apparatus (SCA) for integrating an N-order $\Sigma/\Delta$ ADC and N pieces of 1-order switching-capacitor DAC according to an embodiment of the present invention. The SCA 400 in FIG. 4 is similar to the SCA 300 in FIG. 3. The difference from FIG. 3 is that when the SCA 400 is set as the digital-to-analog mode by the control signal CTRL, all integration units 430_1~430_N are equivalent to N pieces of 1-order switching-capacitor DACs connected in series. In other words, each integration unit of 430_1~430_N feedbacks the output signal thereof to the sampling unit inside the integration unit.

Figure 5:
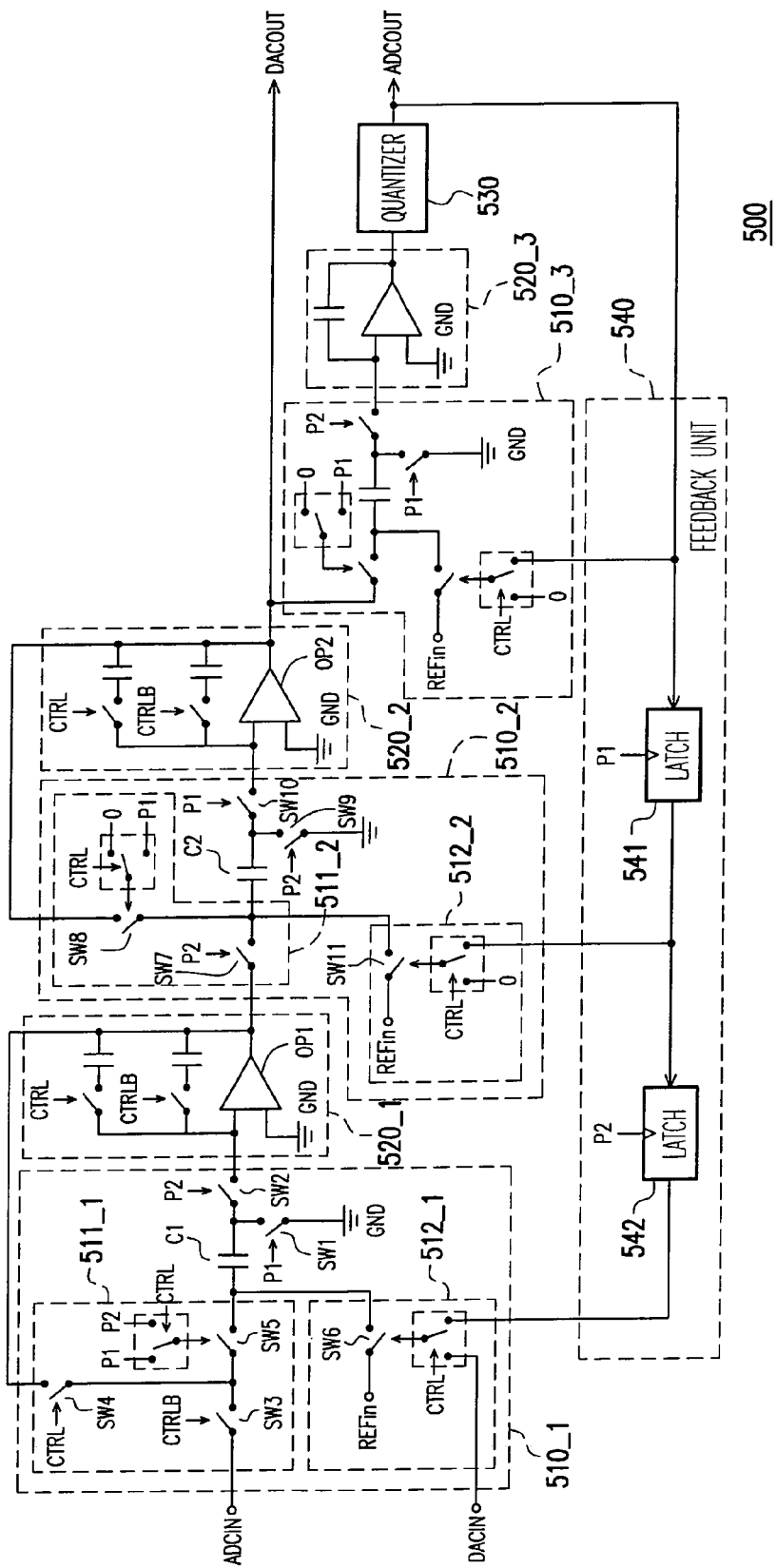
FIG. 5 is a circuit drawing of a signal converting apparatus (SCA) for integrating a 3-order $\Sigma/\Delta$ ADC and two pieces of 1-order switching-capacitor DAC according to an embodiment of the present invention.

To explain the present invention in more detail, another embodiment is described hereinafter. FIG. 5 is a circuit drawing of a signal converting apparatus (SCA) for integrating a 3-order $\Sigma/\Delta$ ADC and two pieces of 1-order switching-capacitor DAC according to an embodiment of the present invention. Referring to FIG. 5, a SCA 500 includes a first sampling unit 510_1, a first integrator 520_1, a second sampling unit 510_2, a second integrator 520_2, a third sampling unit 510_3, a third integrator 520_3, a quantizer 530 and a feedback unit 540. In the embodiment, it is assumed that the control signal CRTL takes a logic-0 corresponding to the analog-to-digital mode with the SCA 500, while the control signal CRTL takes a logic-1 corresponding to the digital-to-analog mode with the SCA 500. Wherein, in the analog-to-digital mode, the SCA 500 converts an analog signal ADCIN at the analog input end thereof and sends a digital signal ADCOUT to the digital output end for output. While in the digital-to-analog mode, the SCA 500 converts a digital signal DACIN at the digital input end thereof and sends an analog signal DACOUT to the analog output end for output.

The $\Sigma/\Delta$ (integration/difference) ADC integrated by the SCA 500 is a 3-order system herein, and the order number 3 is larger than the order number of two 1-order DAC connected in series. Thus, the first sampling unit 510_1, the first integrator 520_1, the second sampling unit 510_2 and the second integrator 520_2 are shared in both the analog-to-digital mode and the digital-to-analog mode. The second integrator 520_2 provides the analog signal DACOUT for output in the digital-to-analog mode. Besides, the third sampling unit 510_3 and the third integrator 520_3 serve for the analog-to-digital mode only. The quatizer 530 quantizes the output signal from the third integrator 520_3 and provides the digital signal ADCOUT for output at the digital output end to output.

In the embodiment, the feedback unit 540 is formed by, for example, a latch 541 and a latch 542 connected in series. The latches 541 and 542 latch the data signals according to the timings of the phase signals P1 and P2, respectively. The feedback unit 540 outputs the unlatched digital signal ADCOUT to the third sampling unit 510_3, and the latched data signals output from the latches 541 and 542 in the feedback unit 540 are sent to the second sampling unit 510_2 and the first sampling unit 510_1, respectively.

The first sampling unit 510_1 includes a first capacitor C1, a first switch set 511_1, a second switch set 512_1, a first switch SW1 and a second switch SW2. In the analog-to-digital mode, during the first period, when the phase signal P1 is transferred to logic-1 status and the phase signal P2 is transferred to logic-0 status, the switch set 511_1 connects the analog signal ADCIN at the analog input end to the first end of the capacitor C1. In the analog-to-digital mode, during the second period, where the phase signal P1 is transferred to logic-0 status and the phase signal P2 is transferred to logic-1 status, the switch set 511_1 disconnects it during the second period. In the analog-to-digital mode, during the second period, the switch set 512_1 connects the corresponding feedback signal output from the feedback unit 540 to the first end of the capacitor C1, and the switch set 512_1 disconnects it during the first period.

In the digital-to-analog mode, during the second period, the switch set 511_1 connects the integration result from one of integrators (i.e. the integration result of the first integrator 520_1 herein) disposed between the first sampling unit 510_1 and the analog output end to the first end of the capacitor C1 and disconnects it during the first period. While the switch set 512_1 charges the capacitor C1 with the digital signal at the digital input end of the SCA 500 during the first period and disconnects it during the second period.

The switch SW1 is coupled between the second end of the capacitor C1 and a first reference voltage (for example, the grounding voltage GND herein) and used for connecting the first reference voltage to the second end of the capacitor C1 during the first period and disconnecting it during the second period. The switch SW2 is coupled between the second end of the capacitor C1 and the first integrator 520_1 and used for electrically coupling the second end of the capacitor C1 to the first integrator 520_1 during the second period and disconnecting it during the first period.

The above-mentioned switch set 511_1 includes, for example, a third switch SW3; a fourth switch SW4 and a fifth switch SW5. In the analog-to-digital mode, the switch SW3 connects the analog signal ADCIN at the first end thereof to the second end thereof. In the analog-to-digital mode, the first end of the switch SW4 is connected to the second end of the switch SW3. While the second end of the switch SW4 is connected to the output end (i.e. the output end of the first integrator 520_1 herein) at one of the integrators disposed between the first sampling unit 510_1 and the analog output end of the SCA 500. In the digital-to-analog mode, the switch SW4 is turned on between the first end and the second end thereof. While in the analog-to-digital mode, the switch SW4 is turned off. The first end of the switch SW5 is connected to the second end of the switch SW3, while the second end of the switch SW5 is connected to the first end of the capacitor C1. Moreover, in the analog-to-digital mode, the phase signal P1 is selected for switching and controlling the switch SW5 to be turned on during the first period and to be turned off during the second period. In the digital-to-analog mode however, the phase signal P2 is selected for switching and controlling the switch SW5 to be turned on during the second period and to be turned off during the first period.

The above-mentioned switch set 512_1 includes, for example, a sixth switch SW6. The first end of the switch SW6 is coupled to a second reference voltage, for example, a reference input voltage REFin herein. The second end of the switch SW6 is coupled to the first end of the capacitor C1. In the analog-to-digital mode, the feedback unit 540 is selected by switching for outputting a corresponding feedback signal to control the switch SW6, and the switch SW6 is turned on or off according to the feedback signal. In the digital-to-analog mode, the digital signal DACIN at the digital input end is selected for switching and controlling the switch SW6, and the switch SW6 is turned on or off according to the digital signal DACIN.

The above-mentioned first integrator 520_1 includes, for example, a first operational amplifier OP1 and a first capacitor device. The first input end of the first operational amplifier OP1 is coupled to the switch SW2, the second input end thereof is coupled to a third reference voltage (for example, the grounding voltage GND herein). The first end of the first capacitor device is coupled to the first input end of the operational amplifier OP1, and the second end of the first capacitor device is coupled to the output end of the operational amplifier OP1. The capacitance of the first capacitor device is determined by the control signal CTRL.

The integration unit formed by the second sampling unit 510_2 and the second integrator 520_2 is connected in series between the first integrator 520_1 and the quantizer 530 and connected in series between the first integrator 520_1 and the analog output end of the SCA 500. In the analog-to-digital mode, the sampling unit 510_2 samples the integration result of the first integrator 520_1. Further, a second differential signal is output according to the sampling result and the corresponding feedback signal output from the feedback unit 540. While in the digital-to-analog mode, the sampling unit 510_2 samples the integration result of the first integrator 520_1. Further, a second differential signal is output according to the sampling result and the integration result of the integrator 520_2. The integrator 520_2 is coupled to the sampling unit 510_2 for integrating the second differential signal and outputting the integration result as the analog signal DACOUT to the analog output end.

The sampling unit 510_2 includes a second capacitor C2, a third switch set 511_2, a fourth switch set 512_2, a ninth switch SW9 and a tenth switch SW10. The switch set 511_2 includes a seventh switch SW7 and an eighth switch SW8. The switch SW7 is coupled between the output end of the first integrator 520_1 and the first end of the capacitor C2, and the phase signal P2 turns on or off the switch SW7. The first end of the switch SW8 is coupled to the first end of the capacitor C2. The second end of the switch SW8 is coupled to the output end of an integrator (i.e. the integrator 520_2 herein) disposed between the sampling unit 510_2 and the analog output end of the SCA 500. In the digital-to-analog mode, the phase signal P1 is selected for switching and controlling the switch SW8 to be on or off according to the timing of the phase signal P1. While in the analog-to-digital mode, the signal with logic-0 is selected for switching and controlling the switch SW8 to be off. The switch set 512_2 is coupled to the capacitor C2. In the analog-to-digital mode, according to the corresponding timing the switch set 512_2 connects the corresponding feedback signal output from the feedback unit 540 to the first end of the capacitor C2. While in the digital-to-analog mode, the switch set 512_2 is turned off. The switch SW9 is coupled between the second end of the capacitor C2 and the first reference voltage (i.e. the grounding voltage GND herein). The switch SW9 is turned on or off by the phase signal P2. The switch SW10 is coupled between the second end of the capacitor C2 and the integrator 520_2, and the switch SW10 is turned on or off by the phase signal P1.

The switch set 512_2 includes an eleventh switch SW11. The first end of the switch SW 11 is coupled to the second reference voltage, for example a reference input voltage REFin herein. The second end of the switch SW11 is coupled to the first end of the capacitor C1. In the analog-to-digital mode, the feedback unit 540 is selected for switching and outputting a corresponding feedback signal to control the switch SW11, and the switch SW11 is turned on or off according to the feedback signal. In the digital-to-analog mode, the signal of logic-0 is selected for switching and controlling the switch SW11 to be off.

The integrator 520_2 includes a second operational amplifier OP2 and a second capacitor device. The first input end of the second operational amplifier OP2 is coupled to the switch SW10, and the second input end thereof is coupled to a third reference voltage (for example, the grounding voltage GND herein). The first end of the second capacitor device is coupled to the first input end of the operational amplifier OP2, and the second end of the second capacitor device is coupled to the output end of the operational amplifier OP2. The capacitance of the second capacitor device is determined by the control signal CTRL.

The third sampling unit 510_3 is electrically coupled between the first integrator 520_1 and the quantizer 530. In the embodiment, the sampling unit 510_3 is coupled to the output end of the integrator 520_2. The third integrator 520_3 is electrically coupled between the sampling unit 510_3 and the quantizer 530. The third integrator integrates the output signal from the sampling unit 510_3 and outputs the integration result to the quantizer 530.

Figure 6A:
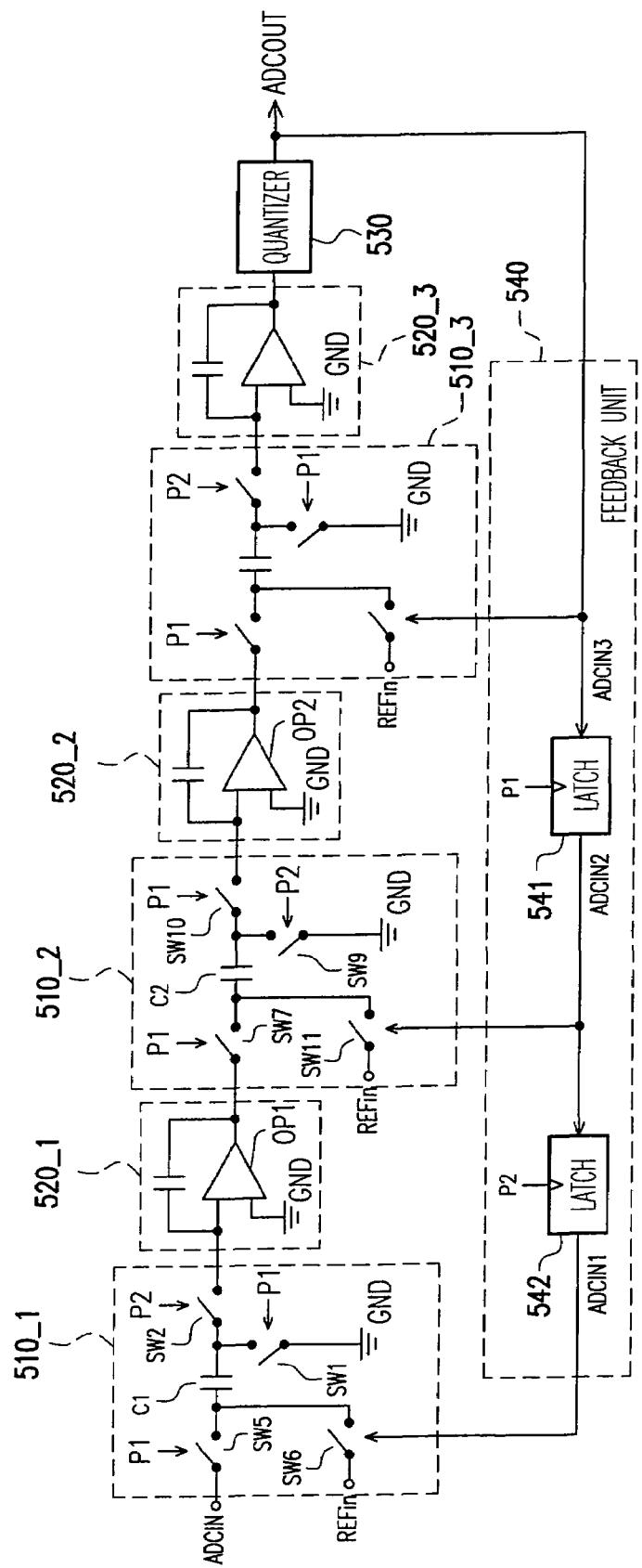
FIG. 6A is a schematic equivalent circuit drawing of the SCA in FIG. 5 operating in analog-to-digital mode.
Figure 7A:
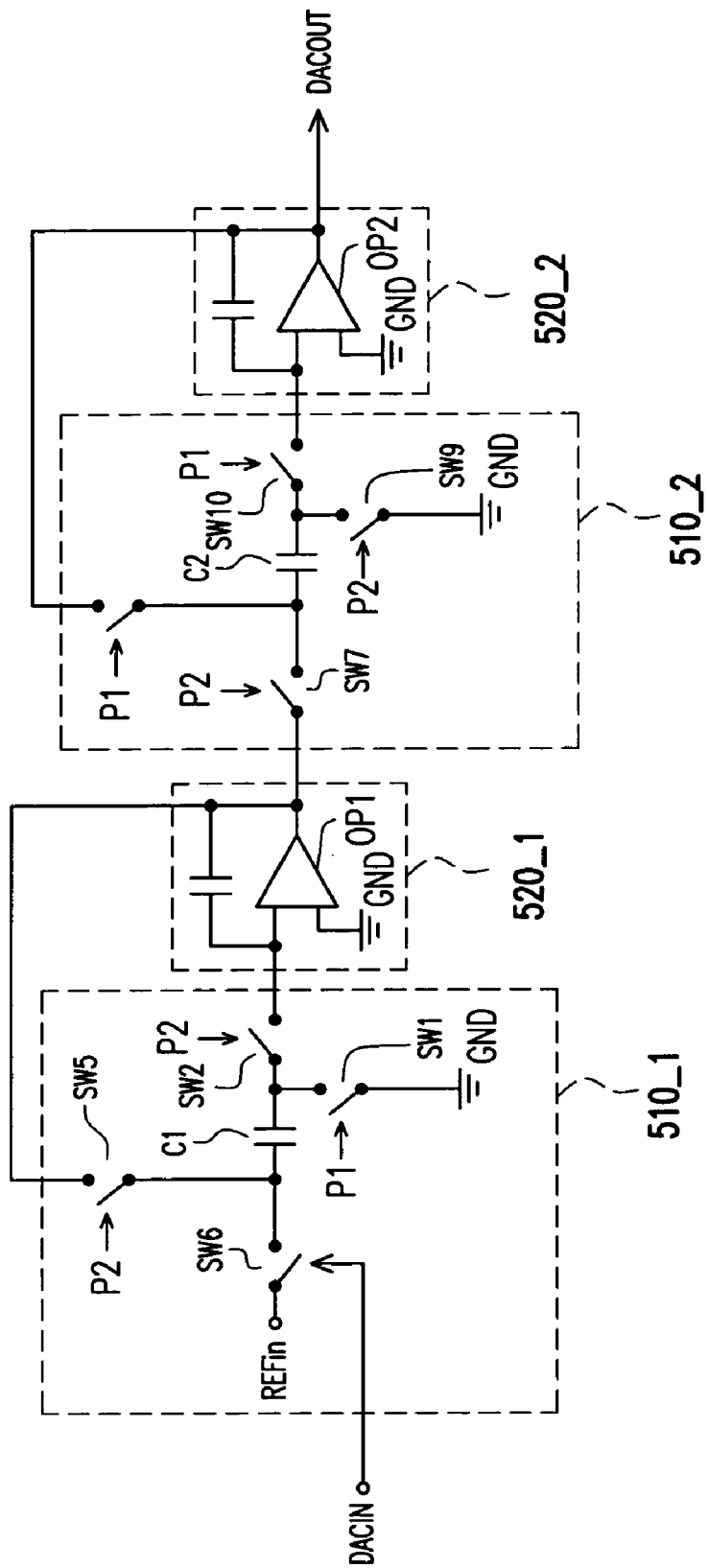
FIG. 7A is a schematic equivalent circuit drawing of the SCA in FIG. 5 operating in digital-to-analog mode.

To better understand the SCA 500 operation modes selected by the control signal CTRL, i.e. the analog-to-digital mode and the digital-to-analog mode, FIG. 6A and FIG. 7A are presented. FIG. 6A and FIG. 7A are schematic equivalent circuit drawings of the SCA 500 operating in analog-to-digital mode and in digital-to-analog mode, respectively. Same elements in FIGS. 5, 6A and 7A are marked with the same indication numbers.

Figure 6B:
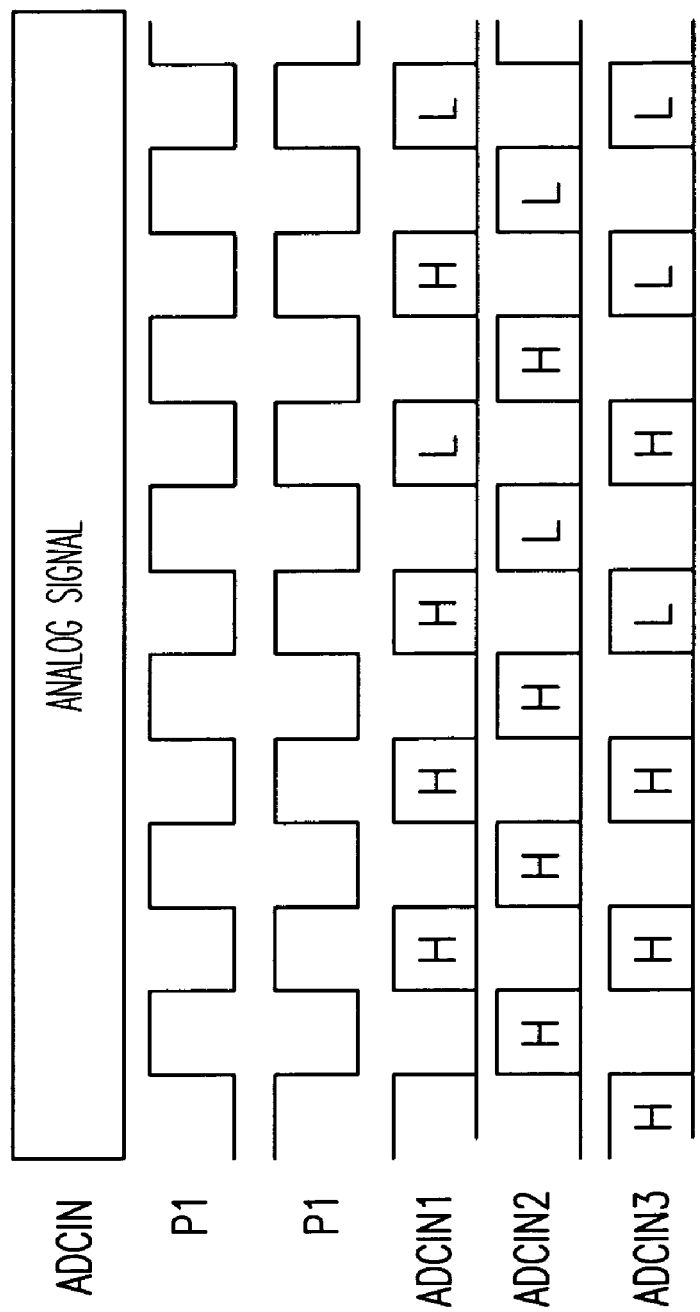
FIG. 6B is a schematic signal timing drawing of the SCA in FIG. 5 operating in analog-to-digital mode.

FIG. 6A is a schematic equivalent circuit drawing of the SCA 500 in an analog-to-digital mode. FIG. 6B is a schematic signal timing drawing of the SCA 500 in an analog-to-digital mode. In FIG. 6A, the signal paths and the switch statuses that are disconnected in the analog-to-digital mode of the SCA 500 are not illustrated. In addition, in FIG. 6A the switches that are connected in the analog-to-digital mode of the SCA 500 are illustrated by short circuits. Referring to FIGS. 6A and 6B, in the analog-to-digital mode, the SCA 500 serves as a 3-order $\Sigma/\Delta$ (integration/difference) ADC. The phase signals P1 and P2 are inverse to each other in terms of timing. When the SCA 500 works in the analog-to-digital mode, during the first period, the sampling unit 510_1 and 510_3 sample the analog signal ADCIN and the output signal from the integrator 520_2, respectively. The sampling unit 510_2 conducts a subtraction operation on the previously sampled signal output from the integrator 520_1 and a feedback signal ADCIN2 output from the latch 541. Then, the result signal of the subtraction operation is sent to the integrator 520_2. During the second period, the sampling unit 510_1 conducts a subtraction operation on the previously sampled analog signal ADCIN and a feedback signal ADCIN1 output from the latch 542; the sampling unit 510_3 conducts a subtraction operation on the previously sampled signal output from the integrator 520_2 and a feedback signal ADCIN3 output from the latch 542. The result signals of the subtraction operations are sent to the integrator 520_1 and 520_3, respectively. Meanwhile, the sampling unit 510_2 samples the signal output from the integrator 520_1.

Figure 7B:
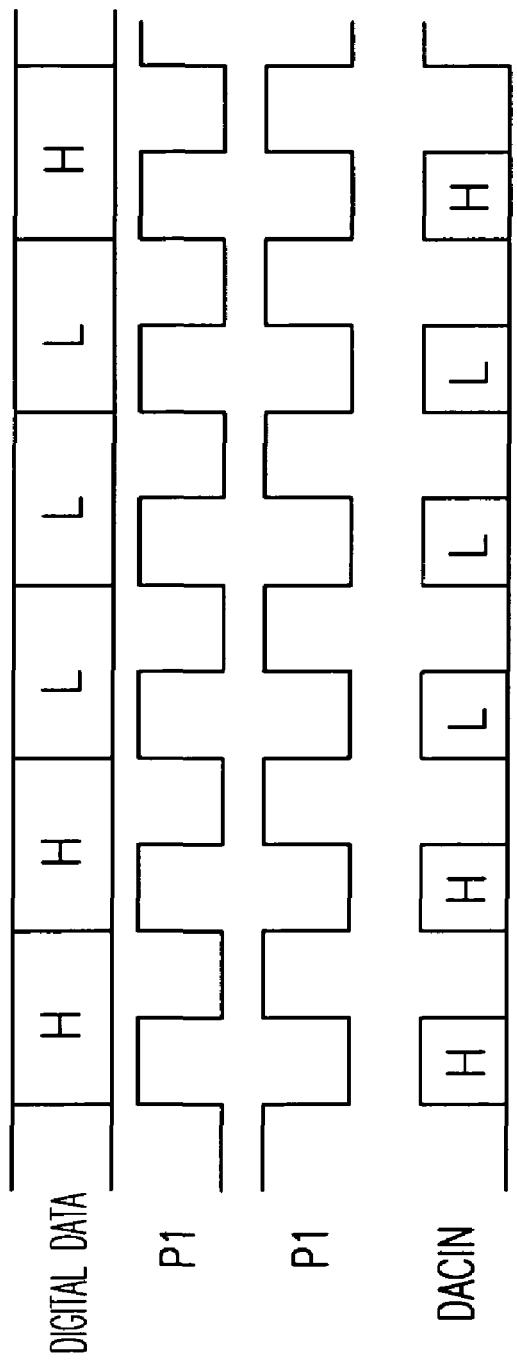
FIG. 7B is a schematic signal timing drawing of the SCA in FIG. 5 operating in digital-to-analog mode.

FIG. 7A is a schematic equivalent circuit drawing of the SCA 500 in FIG. 5 operating in digital-to-analog mode. FIG. 7B is a schematic signal timing drawing of the SCA in FIG. 5 operating in digital-to-analog mode. In FIG. 7A, the signal paths and the switch statuses that are disconnected in the digital-to-analog mode of the SCA 500 are not illustrated. In addition, in FIG. 7A the switches that are connected in the digital-to-analog mode of the SCA 500 are illustrated by short circuits. Referring to FIGS. 7A and 7B, in the digital-to-analog mode, the SCA 500 serves as two of 1-order switched capacitor DACs connected in series. When the SCA 500 works in the digital-to-analog mode, during the first period, the sampling unit 510_1 samples the digital signal DACIN and the sampling unit 510_2 conducts a subtraction operation on the previously sampled signal output from the integrator 520_1 and the signal output from the integrator 520_2. Then, the result signal of the subtraction operation is sent to the integrator 520_2. During the second period, the sampling unit 510_1 conducts a subtraction operation on the previously sampled digital signal DACIN and the signal output from the integrator 520_1, and the result signal of the subtraction operation is sent to the integrator 520_1. Meanwhile, the sampling unit 510_2 samples the signal output from the integrator 520_1.

Figure 8:
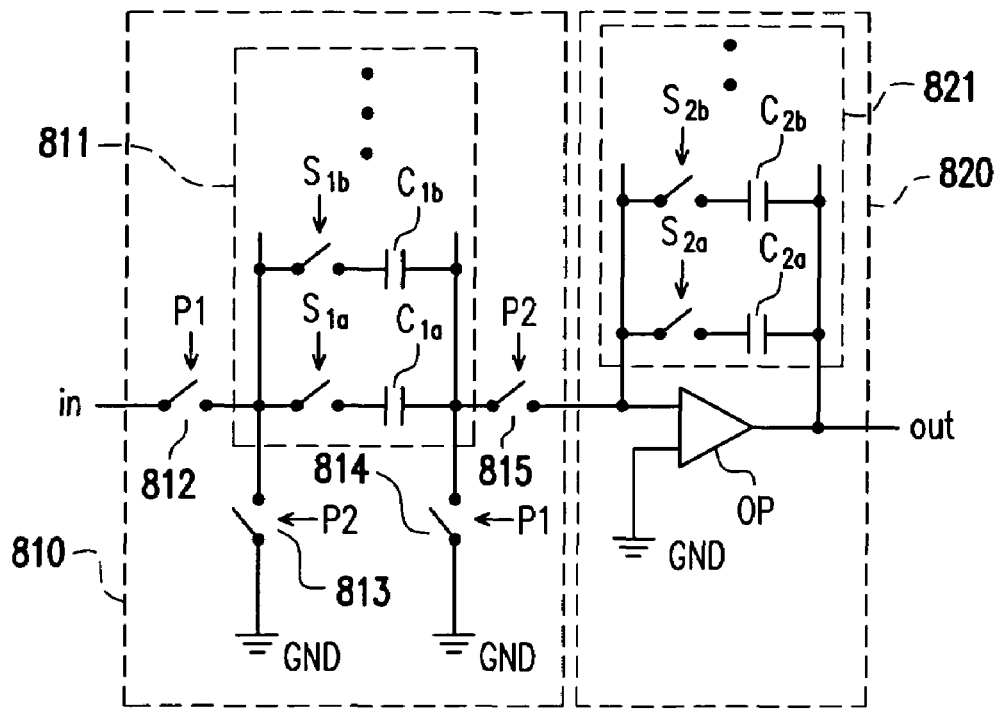
FIG. 8 is a schematic circuit drawing of an integration unit according to another embodiment of the present invention.

In the above-described embodiments, the capacitance of the capacitor devices in the integrators of all integration units are determined by the control signal CTRL, so that the different capacitance ratios for the analog-to-digital mode and the digital-to-analog mode of the SCA 500 operation are obtained. However, in the present invention, the determined capacitance of the capacitor devices is not limited to the above-mentioned control signal CTRL. FIG. 8 gives another embodiment of the integration unit. Referring to FIG. 8, an integration unit 800 has an input end "in" and an output end "out". The integration unit 800 includes a sampling unit 810 and an integrator 820. The sampling unit 810 includes a first capacitor device 811, a first switch 812, a second switch 813, a third switch 814 and a fourth switch 815. The integrator 820 includes a second capacitor device 821 and an operational amplifier OP. Wherein, the capacitance of the capacitor device 811 and the capacitor device 821 are determined by the control signals including $S_{1a}$, $S_{1b}$, ... and $S_{2a}$, $S_{2b}$, .... The capacitor device 811 comprises a plurality of first capacitors $C_{1a}$, $C_{1b}$, ... and a plurality of control switches which are controlled by the corresponding signals $S_{1a}$, $S_{1B}$, ..., respectively. The capacitor device 821 comprises a plurality of second capacitors $C_{2a}$, $C_{2b}$, ... and a plurality of control switches which are controlled by the corresponding signals $S_{2a}$, $S_{2B}$, ..., respectively.

In FIG. 8, the first end of the switch 812 is just the input end of the integration unit 800. The second end of the switch 812 is coupled to the first end of the capacitor device 811. The phase signal P1 controls the switch 812 to be on during the first period, and to be off during the second period. The first end of the switch 813 is coupled to the first end of the capacitor device 811, and the second end of the switch 813 is coupled to the first voltage (for example, the grounding voltage herein). The phase signal P2 controls the switch 813 to be on during the second period, and to be off during the first period. The first end of the switch 814 is coupled to the second end of the capacitor device 811, and the second end of the switch 814 is coupled to the second voltage (for example, the grounding voltage herein). The phase signal P1 controls the switch 814 to be on during the first period, and to be off during the second period. The first end of the switch 815 is coupled to the second end of the capacitor device 811, and the second end of the switch 815 is coupled to the first end of the capacitor device 821. The phase signal P2 controls the switch 815 to be on during the second period, and to be off during the first period. The first input end of the operational amplifier OP is coupled to the first end of the capacitor device 821, and the output end of the operational amplifier OP is coupled to the second end of the capacitor device 821.

It is assumed that the first capacitors $C_{1a}$, $C_{1b}$ and the control switches controlled by the signal $S_{1a}$ and $S_{1b}$ respectively form the capacitor device 811 of the integration unit 800, and the second capacitors $C_{2a}$, $C_{2b}$ and the control switches controlled by the signal $S_{2a}$ and $S_{2b}$ respectively form the capacitor device 821 of the integration. By means of the various control signals $S_{1a}$, $S_{1b}$, $S_{2a}$ and $S_{2b}$ for controlling the control switches, there would be at most 9 capacitance coefficients, i.e. 9 capacitance ratios, in the integration unit 800. The 9 capacitance coefficients are $[C_{1a}/C_{2a}]$, $[C_{1b}/C_{2a}]$, $[(C_{1a}+C_{1b})/C_{2a}]$, $[C_{1a}/C_{2b}]$, $[C_{1b}/C_{2b}]$, $[(C_{1a}+C_{1b})/C_{2b}]$, $[C_{1a}/(C_{2a}+C_{2b})]$, $[C_{1b}/(C_{2a}+C_{2b})]$ and $[(C_{1a}+C_{1b})/(C_{2a}+C_{2b})]$. It can be seen here that the capacitor devices 811 and 821 can be formed by any integer number of capacitors to obtain the various required capacitance coefficients (capacitance ratios).

In summary, the present invention integrates two, ADC and DAC, that do not operate simultaneously, into a single circuit, wherein a control signal decides whether an analog-to-digital mode or a digital-to-analog mode is selected. By sharing the operational amplifiers and other components in the SCA, the chip area and the cost are significantly reduced. In addition, by means of a plurality of capacitors with various capacitance in the integration unit, the various capacitance coefficients required for switching the analog-to-digital mode or the digital-to-analog mode are obtained.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A signal converting apparatus (SCA), for switching the operation mode thereof into an analog-to-digital mode or a digital-to-analog mode by a control signal, wherein the SCA converts an analog signal at an analog input end thereof and outputs the converted digital signal at a digital output end thereof in the analog-to-digital mode, and the SCA converts a digital signal at a digital input end thereof and outputs the converted analog signal at an analog output end thereof in the digital-to-analog mode; the SCA comprising:
   a feedback unit, for outputting at least one feedback signal according to the digital signal output from the digital output end;
   a first sampling unit, coupled to the analog input end, the digital input end and the feedback unit, in the analog-to-digital mode, for sampling the analog signal at the analog input end into a sampling signal during a first period and outputting a differential signal according to the sampling signal and the corresponding feedback signal output from the feedback unit during a second period, and in the digital-to-analog mode, for sampling the digital signal at the digital input end into a sampling signal during the first period and outputting a differential signal according to the sampling signal and an integration result from one of the integrators disposed between the first sampling unit and the analog output end during the second period;
   a first integrator, electrically coupled to the first sampling unit and the analog output end, for integrating the differential signal; and
   a quantizer, electrically coupled to the first integrator and the digital output end, for quantizing the input signal of the quantizer and providing a digital signal output at the digital output end.

2. The signal converting apparatus as recited in claim 1, wherein the first sampling unit comprises:
   a first capacitor;
   a first switch set, coupled to the analog input end and the first capacitor, in the analog-to-digital mode, for connecting the analog input to the first end of the first capacitor during the first period and disconnecting it during the second period, and in the digital-to-analog mode, for connecting an integration result from one of the integrators disposed between the first sampling unit and the analog output end to the first end of the first capacitor during the second period and disconnecting it during the first period;
   a second switch set, coupled to the digital input end and the first capacitor, in the analog-to-digital mode, for charging the first capacitor according to the corresponding feedback signal output from the feedback unit during the second period and disconnecting it during the first period, and in the digital-to-analog mode, for charging the first capacitor according to the digital signal at the digital input end during the first period and disconnecting it during the second period;
   a first switch, coupled between the second end of the first capacitor and a first reference voltage, for connecting the first reference voltage to the second end of the first capacitor during the first period and disconnecting it during the second period; and
   a second switch, coupled between the second end of the first capacitor and the first integrator, for connecting the second end of the first capacitor to the fast integrator during the second period and disconnecting it during the first period.

3. The signal converting apparatus as recited in claim 2, wherein the first switch set comprises:
   a third switch, wherein the first end thereof is coupled to the analog input end, for connecting the first end and second end thereof in the analog-to-digital mode, and disconnecting the first end and second end thereof in the digital-to-analog mode;
   a fourth switch, wherein the first end thereof is coupled to the second end of the third switch and the second end thereof is coupled to the output end at one of the integrators disposed between the first sampling unit and the analog output end, for connecting the first end and second end thereof in the digital-to-analog mode and disconnecting the first end and second end thereof in the analog-to-digital mode; and
   a fifth switch, wherein the first end thereof is coupled to the second end of the third switch and the second end thereof is coupled to the first end of the first capacitor, in the analog-to-digital mode, for connecting the first end and second end thereof during the first period, and disconnecting the first end and second end thereof during the second period, and in the digital-to-analog mode, connecting the first end and second end thereof during the second period and disconnecting the first end and second end thereof during the first period.

4. The signal converting apparatus as recited in claim 2, wherein the second switch set comprises:
   a sixth switch, wherein the first end thereof is coupled to a second reference voltage and the second end thereof is coupled to the first end of the first capacitor, for determining a connection status of the sixth switch according to a corresponding feedback signal output from the feedback unit in the analog-to-digital mode, and determining a connection status of the sixth switch according to the digital signal at the digital input end in the digital-to-analog mode.

5. The signal converting apparatus as recited in claim 1, wherein the first integrator comprises:
   a first operational amplifier, wherein the first input end thereof is coupled to the first sampling unit and the second input end thereof is coupled to a third reference voltage; and
   a first capacitor device, wherein the first end thereof is coupled to the first input end of the first operational amplifier and the second end thereof is coupled to the output end of the first operational amplifier, and the capacitance thereof is determined by the control signal.

6. The signal converting apparatus as recited in claim 1, further comprising:
  at least an integration unit, coupled in series between the first integrator and the quantizer and coupled in series between the first integrator and the analog output end, wherein the integration unit comprises:
  a second sampling unit, in the analog-to-digital mode, for sampling the input signal of the integration unit and outputting a second differential signal according to the sampling result and the corresponding feedback signal output from the feedback unit, and in the digital-to-analog mode, for sampling the input signal of the integration unit and outputting the second differential signal according to the sampling result and the integration result from one of the integrators disposed between the integration unit and the analog output end; and
  a second integrator, electrically coupled to the second sampling unit and the analog output end for integrating the second differential signal.

7. The signal converting apparatus as recited in claim 6, wherein the second sampling unit comprises:
  a second capacitor;
  a fourth switch set, coupled to the second capacitor, in the analog-to-digital mode, for charging the second capacitor according to the corresponding feedback signal output from the feedback unit and disconnecting it in the digital-to-analog mode;
  a seventh switch, coupled between the input end of the integration unit and the first end of the second capacitor;
  an eighth switch, wherein the first end thereof is coupled to the first end of the second capacitor and the second end thereof is coupled to the output end at one of the integrators disposed between the integration unit and the analog output end, for determining a connection status of the eighth switch according to a corresponding timing in the digital-to-analog mode and disconnecting the eighth switch in the analog-to-digital mode;
  a ninth switch, coupled between the second end of the second capacitor and the first reference voltage, for determining a connection status of the ninth switch according to a corresponding timing; and
  a tenth switch, coupled between the second end of the second capacitor and the second integrator, for determining a connection status of the tenth switch according to a corresponding timing.

8. The signal converting apparatus as recited in claim 7, wherein the fourth switch set comprises:
  an eleventh switch, wherein the first end thereof is coupled to a second reference voltage and the second end thereof is coupled to the first end of the second capacitor, for determining a connection status of the eleventh switch according to a corresponding feedback signal output from the feedback unit in the analog-to-digital mode, and disconnecting the eleventh switch in the digital-to-analog mode.

9. The signal converting apparatus as recited in claim 6, wherein the second integrator comprises:
  a second operational amplifier, wherein the first input end thereof is coupled to the tenth switch and the second input end thereof is coupled to a third reference voltage; and
  a second capacitor device, wherein the first end thereof is coupled to the first input end of the second operational amplifier and the second end thereof is coupled to the output end of the second operational amplifier, and the capacitance thereof is determined by the control signal.

10. The signal converting apparatus as recited in claim 1, further comprising:
  a third sampling unit, electrically coupled between the first integrator and the quantizer; and
  a third integrator, electrically coupled between the third sampling unit and the quantizer for outputting an integration result to the quantizer according to the sampling result of the third sampling unit.

* * * * *